United States Patent [19]

De Keyzer et al.

[11] Patent Number: 5,629,131
[45] Date of Patent: *May 13, 1997

[54] IMAGE RECEIVING LAYER FOR USE IN A SILVER SALT DIFFUSION TRANSFER PROCESS

[75] Inventors: René De Keyzer, Waasmunster; Yves Van Meenen, Berchem, both of Belgium

[73] Assignee: Agfa-Gevaert, N.V., Mortsel, Belgium

[*] Notice: The term of this patent shall not extend beyond the expiration date of Pat. No. 5,618,650.

[21] Appl. No.: 639,442

[22] Filed: Apr. 29, 1996

[30] Foreign Application Priority Data

May 2, 1995 [EP] European Pat. Off. ............. 95201134

[51] Int. Cl.⁶ .................................... G03C 8/28; G03F 7/07
[52] U.S. Cl. .......................... 430/204; 430/231; 428/454
[58] Field of Search ................................. 430/231, 232, 430/204; 428/454

[56] References Cited

U.S. PATENT DOCUMENTS

| | | | |
|---|---|---|---|
| 3,345,168 | 10/1967 | Wagner et al. | 430/231 |
| 3,709,687 | 1/1973 | Land | 430/231 |
| 4,621,041 | 11/1986 | Saikawa et al. | 430/204 |
| 5,153,097 | 10/1992 | Nishinoiri et al. | 430/204 |
| 5,496,679 | 3/1996 | Hauquier et al. | 430/204 |

*Primary Examiner*—Richard L. Schilling
*Attorney, Agent, or Firm*—Breiner & Breiner

[57] ABSTRACT

The present invention provides an image receiving material comprising a receiving layer containing physical development nuclei characterized in that said physical development nuclei are grown on a colloidal smectic clay. Said image receiving material may be provided wih a photosensitive silver halide emulsion layer or may form a separate receiving element.

The image receiving materials of the present invention can also be used for making lithographic printing plates having good printing properties.

11 Claims, No Drawings

IMAGE RECEIVING LAYER FOR USE IN A SILVER SALT DIFFUSION TRANSFER PROCESS

DESCRIPTION

1. Field of the Invention

The present invention relates to a silver salt diffusion transfer material and to a method for obtaining an image or a lithographic printing plate therewith.

2. Background of the Invention

The principle of the silver complex diffusion transfer process (hereinafter referred to as DTR process) is well known from the description in U.S. Pat. No. 2,352,014 and in the book "Photographic Silver Halide Diffusion Processes" by André Rott and Edith Weyde—The Focal Press—London and New York, (1972).

In the DTR process, the silver complex is imagewise transferred by diffusion from a silver halide emulsion layer to an image receptive layer and transformed therein into a silver image generally in the presence of physical development nuclei. For this purpose, the imagewise exposed silver halide emulsion layer is arranged so as to be in contact with or is brought into contact with the image receptive layer in the presence of a developing agent and a solvent for the silver halide, thereby to convert the unexposed silver halide into a soluble silver complex. In the exposed areas of the silver halide emulsion layer, the silver halide is developed into silver which is insoluble and, hence, cannot diffuse. In the unexposed areas of the silver halide emulsion layer, the silver halide is converted into a soluble silver complex and is transferred to an image receptive layer wherein the silver complex formes a silver image generally in the presence of physical development nuclei.

The DTR process can be utilized in a wide field such as reproduction of documents, making of printing plates, preparation of block copies, and instant photography.

Particularly in reproducing documents or preparing block copies, an imaging element having a silver halide emulsion layer is brought into close contact with a positive material having an image receptive layer in a DTR processing solution generally containing a silver-complexing agent, thereby to form a silver image in the receptive layer of the positive material. The silver image in these cases is required to be in such a state that it is pure black or bluish black in color and sufficiently high in density. It is also important that the silver image be high in contrast and sharpness, excellent in image reproducibility, and preferably high in transfer speed.

U.S. Pat. No. 3,345,168 discloses a method so that multiple copies can be obtained from a single negative. Said object is attained by precipitating the developed nuclei in the absence of a water-soluble colloid but in a suspension of china clay.

As mentioned above the DTR-process can also be used for making lithographic printing plates. A DTR-image bearing material can be used as a planographic printing plate wherein the DTR-silver image areas form the water-repellant ink-receptive areas on a water-receptive ink-repellant surface. The DTR-image can be formed in the image-receiving layer of a sheet or web material which is a separate element with respect to the photographic silver halide emulsion material (a so-called two-sheet DTR element) disclosed in e.g. DE-A-2.346.378 or in the image-receiving layer of a so-called single-support-element, also called mono-sheet element, which contains at least one photographic silver halide emulsion layer integral with an image-receiving layer in water permeable relationship therewith. It is the latter mono-sheet version which is preferred for the preparation of offset printing plates by the DTR method.

To obtain good lithographic properties with such an imaging element it is important that a strong wear resistant silver image is formed in the image receiving layer to obtain a high printing endurance.

With respect to these requirements the state of the transferred silver i.e. the silver formed in the image-receiving layer plays a very important role. Parameters that are known to control the state of the transferred silver are e.g. the rate of development of the exposed silver halide (chemical development), rate of dissolution of the non-exposed silver halide by the silver halide solvent(s), rate of diffusion of the silver halide complexes, rate of development of the silver halide complexes in the image receiving layer (physical development) etc.. Although other factors such as for example the plate construction have an influence on the aforementioned parameters the type, dimensions and amount of physical development nuclei influence most of the mentioned parameters to a large extent.

Therefore to obtain reproducible results with DTR-materials it is of the utmost importance that the coating solution containing the physical development nuclei is a stable dispersion in order that during the coating of the image receiving layer containing said physical development nuclei a constant amount of said physical development nuclei with stable dimensions is applied during the whole duration of the coating of said layer, which can easily be several hours.

SUMMARY OF THE INVENTION

It is an object of the present invention to provide a DTR-material for obtaining images of high density, high contrast and sharpness and excellent in image quality which can be prepared in an easy and reproducible process.

It is an object of the present invention to provide a DTR-material for making a lithographic printing plate with excellent lithographic printing properties which can be prepared in an easy and reproducible process.

It is an object of the present invention to provide a DTR-process with reproducible results for obtaining an image of high density, high contrast and sharpness and excellent in image quality.

It is an object of the present invention to provide a DTR-process with reproducible results for making a lithographic printing plate with excellent printing properties.

Further objects of the present invention will become clear from the description hereinafter.

According to the present invention there is provided an image receiving material comprising a receiving layer containing physical development nuclei characterized in that said physical development nuclei are grown on a colloidal smectic clay.

According to the present invention there is provided a lithographic printing plate precursor comprising on a support a silver halide emulsion layer and an image receiving layer containing physical development nuclei characterized in that said physical development nuclei are grown on a colloidal smectic clay.

According to the present invention there is provided a method for obtaining an image according to the DTR-process using the above defined image receiving material.

According to the present invention there is provided a method for obtaining a lithographic printing plate according to the DTR-process using the above defined image receiving material or the above defined lithographic printing plate precursor.

DETAILED DESCRIPTION OF THE INVENTION

It has been found that when a DTR-material is prepared comprising an image receiving layer containing physical development nuclei grown on a colloidal smectic clay, said material is easy to prepare and give good reproducible results. Physical development nuclei grown on a colloidal clay form one chemical entity with said colloidal clay.

Clays are essentially hydrous aluminum silicates, wherein alkali metals or alkaline-earth metals are present as principal constituents. Also in some clay minerals magnesium or iron or both replace the aluminum wholly or in part. The ultimate chemical constituents of the clay minerals vary not only in amounts, but also in the way in which they are combined or are present in various clay minerals. Natural clays are well known, but it is also possible to prepare synthetic clays in the laboratory, so that more degrees of freedom can lead to reproducible tailor made clay products for use in different applications.

So from the natural clays smectite clays, including laponites, hectorires and bentonires are well-known. For the said smectite clays some substitutions in both octahedral and tetrahedral layers of the crystal lattice occur, resulting in a small number of interlayer cations. Smectite clays form a group of "swelling" clays which take up water and organic liquids between the composite layers and which have marked cation exchange capacities. From these smectite clays, synthetic chemically pure clays have been produced.

The clays used in accordance with the invention are preferably synthetic smectic clays, more preferably synthetic laponites. So preferred synthetic laponite smectite clay additives for the purposes of this invention are e.g. LAPONITE RD, LAPONITE RDS and LAPONITE JS, trade mark products of LAPORTE INDUSTRIES Limited, London.

Said clays and process for the production thereof have been described in EP-Patent 161 411 B1.

LAPONITE JS is described as a synthetic layered hydrous sodium lithium magnesium fluoro-silicate incorporating an inorganic polyphoshate pepriser. LAPONITE RD is described as a synthetic layered hydrous sodium lithium magnesium silicate incorporating an inorganic polyphoshate peptiser. LAPONITE RDS is described as a synthetic layered hydrous sodium lithium magnesium silicate incorporating an inorganic polyphoshate pepriser. The said silicates appear as free flowing white powder and hydrates well in water to give virtually clear and colourless colloidal dispersions of low viscosity, also called "sols".

The physical development nuclei according to the present invention may be prepared according to known procedures in the presence of a colloidal smectic clay. For example the noble metal nuclei may be prepared as described in U.S. Pat. No. 4,304,835 in the presence of a colloidal smectic clay. The heavy metal sulphides can be prepared by adding an aqueous solution of heavy metal ions to a solution containing sulphide ions in the presence of a colloidal smectic clay.

The weight ratio between the physical development nuclei and the colloidal clay ranges from 10:1 to 1:10, more preferably from 3:1 to 1:3.

Preferably the physical development nuclei according to the invention contained in said receiving layer have a number average diameter in the range from 0.5 nm to 30 nm, more preferably from 1 nm to 20 nm.

Although the size of the nuclei above is expressed by a diameter this does not imply that the nuclei are necessarily spherical. By diameter is meant the diameter of a sphere having the same volume as the nucleus so that the size of nuclei of a variety of shapes can be characterized by the same parameter.

The presence of the physical development nuclei on the colloidal clay and the diameter of said nuclei is determined by Nanoprobe Energy Dispersive X-Ray Fluorescence (HREM-EDX) with a PHILIPS CM 20-EDAX.

The amount of nuclei used in the image receiving layer is preferably between 0.02 mg/m$^2$ and 20 mg/m$^2$, more preferably between 0.04 mg/m$^2$ and 10 mg/m$^2$, most preferably between 0.08 mg/m$^2$ and 5 mg/m$^2$.

According to the present invention the image receiving layer may be contained in a separate image receiving material or may be in water permeable relationship with a light sensitive silver halide emulsion layer in an imaging element.

Layers being in water-permeable contact with each other are layers that are contiguous to each other or only separated from each other by (a) water-permeable layer(s). The nature of a water-permeable layer is such that it does not substantially inhibit or restrain the diffusion of water or of compounds contained in an aqueous solution e.g. developing agents or complexed silver ions.

According to a first embodiment of the present invention an image is obtained by information-wise exposing an imaging element comprising on a support e.g. a paper support or organic resin support a silver halide emulsion layer and subsequently developing said information-wise exposed imaging element in the presence of developing agent(s) and silver halide solvent(s) whilst in contact with an image receiving material comprising on a support a layer containing physical development nuclei according to the invention.

The support of the image receiving material may be opaque or transparent, e.g. a paper support or resin support. Said support may also be a hydrophilic support e.g. a metal support e.g. grained and anodized aluminum or a support provided with a hydrophilic layer as disclosed in DE-A-2.346.378. In the latter case the obtained silver image may be used in a lithographic printing process.

The image receiving layer comprises for best imaging results the physical development nuclei according to the present invention in the presence of a protective hydrophilic colloid, e.g. gelatin and/or colloidal silica, colloidal clay, polyvinyl alcohol etc., the coverage of binder being preferably in the range of 0.4 to 1.5 g/m$^2$.

The image-receiving element may contain in operative contact with the development nuclei thioether compounds, e.g. those described in DE-P 1,124,354, in U.S. Pat. No. 4,013,471 and 4,072,526, and in EP-A 026,520.

Most of the DTR-positive materials now available on the market comprises two or even three layers on the side of the support that contains an image receiving layer. Such materials normally contain on top of a nuclei containing layer a layer which itself preferably contains no nuclei and mainly serves to ensure good contact between the negative and positive material during transfer. Preferably, such top layer comprises a matting agent as are disclosed in e.g. EP-A 584407.

The transfer behaviour of the complexed silver largely depends on the thickness of the image-receiving layer and upperlying layers and on the kind of binding agent or the mixture of binding agents used in said layers. In order to obtain a sharp image with high spectral density the reduction of the silver salts diffusing into the image receiving layer must take place rapidly before lateral diffusion becomes substantial. For this reason the sum of the coverage of the hydrophilic colloids contained in said image receiving layer and said top layer is preferably less than 2 $g/m^2$ and most preferably not more than 1.8 $g/m^2$ and the coverage of the hydrophilic colloids contained in said top layer is preferably less than 0.45 $g/m^2$.

The sum of the coverage of the hydrophilic colloids contained in the top layers of the image-receiving element and the imaging element is preferably not more than 0.80 $g/m^2$.

According to a particular embodiment the nuclei containing layer is present on a nuclei-free water-permeable underlying undercoat layer or undercoat layer system comprising a hydrophilic colloid and having preferably a coverage in the range of 0.05 to 1 $g/m^2$ of hydrophilic colloid The undercoat optionally incorporates substances that improve the image quality, e.g. incorporates a substance improving the image-tone or the whiteness of the image background. For example, the undercoat may contain a fluorescent substance, silver complexing agent(s) and/or development inhibitor releasing compounds known for improving image sharpness.

According to a special embodiment the image-receiving layer is applied on an undercoat playing the role of a timing layer in association with an acidic layer serving for the neutralization of alkali of the image-receiving layer. By the timing layer the time before neutralization occurs is established, at least in part, by the time it takes for the alkaline processing composition to penetrate through the timing layer. Materials suitable for neutralizing layers and timing layers are disclosed in Research Disclosure July 1974, item 12331 and July 1975, item 13525.

In the image-receiving layer and/or in said top layer and/or in the undercoat layer gelatin is used preferably as hydrophilic colloid. In the image-receiving layer gelatin is present preferably for at least 60% by weight and is optionally used in conjunction with an other hydrophilic colloid, e.g. polyvinyl alcohol, cellulose derivatives, preferably carboxymethyl cellulose, dextran, gallactomannans, alginic acid derivatives, e.g. alginic acid sodium salt and/or water-soluble polyacrylamides. Said other hydrophilic colloid may be used also in the top layer for at most 10% by weight and in the undercoat in an amount lower than the gelatin content.

The image-receiving layer and/or a hydrophilic colloid layer in water-permeable relationship therewith may comprise a silver halide developing agent and/or silver halide solvent, e.g. sodium thiosulphate in an amount of approximately 0.1 $g/m^2$ to approximately 4 $g/m^2$.

The image-receiving layer or a hydrophilic colloid layer in water-permeable relationship therewith may comprise colloidal silica or a colloidal clay.

In at least one of the layers of the present image-receiving material substances can be contained, which play a role in the determination of the colour tone of the diffusion transfer silver image. Substances providing a neutral colour tone are called black-toning agents. e.g. as described in GB A 561,875 and BE A 502,525.

According to a preferred embodiment the processing liquid that will be described in detail below and/or the image-receiving material contains at least one image toning agent. In said case the image toning agent(s) may gradually transfer by diffusion from said image-receiving element into the processing liquid and keep therein the concentration of said agents almost steady. In practice such can be realized by using the silver image toning agents in a coverage in the range from 1 $mg/m^2$ to 20 $mg/m^2$ in a hydrophilic water-permeable colloid layer.

A survey of suitable toning agents is given in the above mentioned book of André Rott and Edith Weyde, p. 61–65, preference being given to 1-phenyl-1H-tetrazole-5-thiol, also called 1-phenyl-5-mercapto-tetrazole, tautomeric structures and derivatives thereof.

Still further toning agents suitable for use in accordance with the preferred embodiment of the present invention are the toning agents described in EP-A 218752, 208346, 218753, 546599 and U.S. Pat. No. 4,683,189.

According to a practical embodiment in the image-receiving element the development nuclei containing layer and/or hydrophilic colloid layer in water-permeable relationship therewith or a back layer at the side of the support opposite to that carrying the image receiving layer contains at least part of the silver image toning agents. Such procedure results actually in automatic replenishment of toning agent in the processing liquid. The same applies at least partially for the replenishment of the developing agent(s) and silver halide complexing agent(s).

When applying an optical brightening agent in the present image-receiving material preference is given to an optical brightening agent that is inherently by its structure resistant to diffusion or is made resistant to diffusion by use in conjunction with another substance wherein it is dissolved or whereto it is adsorbed.

The hydrophilic colloid comprising layers of the present image-receiving material and imaging material may have been hardened to achieve enhanced mechanical strength. Appropriate hardening agents for hardening the natural and/or synthetic hydrophilic colloid binding agents in the image-receiving layer include e.g. formaldehyde, glyoxal, mucochloric acid, and chrome alum. Hardening can also be effected by incorporating a hardener precursor in said layers, the hardening of the hydrophilic colloid therein being triggered by the treatment with the alkaline processing liquid. Other suitable hardening agents for hardening the hydrophilic colloid binding agents in the image-receiving layer are vinylsulphonyl hardeners, e.g. as described in Research Disclosure 22,507 of January 1983.

The image-receiving material can be used in conjunction with any type of photographic silver halide emulsion material suited for use in diffusion transfer reversal processing. The silver halide emulsion material may contain more than one silver halide emulsion layer.

In the imaging material in connection with the present invention, the photosensitive silver halide emulsion layer can be coated from any photosensitive silver halide emulsion comprising a hydrophilic colloid binder. Preferably, the coverage of hydrophilic colloid contained in said layer is not more than 3.5 $g/m^2$, more preferably not more than 2.4 $g/m^2$. The weight ratio of hydrophilic colloid binder to silver halide expressed as equivalent amount of silver nitrate to binder is preferably in the range of 3:1 to 1:3.

The photosensitive silver halide used in the present invention may be any type of photographic silver halide emulsion material suited for use in diffusion transfer reversal processing, preference being given to silver halide emulsion layers the silver halide of which is mainly silver chloride because of its relatively easy complexing with thiosulphate ions. The silver halide grains can have any size or shape and may be prepared by any technique known in the art, e.g. by single-jet or double jet precipitation.

The average size of the silver halide grains may range from 0.10 to 0.70 µm, preferably from 0.25 to 0.45 µm.

Preferably during the precipitation stage Iridium and/or Rhodium containing compounds or a mixture of both are added. The concentration of these added compounds ranges from $10^{-8}$ to $10^{-3}$ mole per mole of $AgNO_3$, preferably between $0.5*10^{-7}$ and $10^{-5}$ mole per mole of $AgNO_3$.

The emulsions can be chemically sensitized e.g. by adding sulphur-containing compounds during the chemical ripening stage e.g. allyl isothiocyanate, allyl thiourea, and sodium thiosulphate. Also reducing agents e.g. the tin compounds described in BE-P 493,464 and 568,687, and polyamines such as diethylene triamine or derivatives of aminomethane-sulphonic acid can be used as chemical sensitizers. Other suitable chemical sensitizers are noble metals and noble metal compounds such as gold, platinum, palladium, iridium, ruthenium and rhodium. This method of chemical sensitization has been described in the article of R. KOSLOWSKY, Z. Wiss. Photogr. Photophys. Photochem. 46, 65–72 (1951).

The spectral photosensitivity of the silver halide can be adjusted by proper spectral sensitization by means of the usual mono- or polymethine dyes such as acidic or basic cyanines, hemicyanines, oxonols, hemioxonols, styryl dyes or others, also trior polynuclear methine dyes e.g. rhodacyanines or neocyanines. Such spectral sensitizers have been described by e.g. F. M. HAMER in "The Cyanine Dyes and Related Compounds" (1964) Interscience Publishers, John Wiley & Sons, New York.

The silver halide emulsions may contain the usual stabilizers. Suitable stabilizers are azaindenes, preferably tetra- or penta-azaindenes, especially those substituted with hydroxy or amino groups. Compounds of this kind have been described by BIRR in Z. Wiss. Photogr. Photophys. Photochem. 47, 2–27 (1952). Other suitable stabilizers are i.a. heterocyclic mercapto compounds e.g. phenylmercaptotetrazole, quaternary benzothiazole derivatives and benzotriazole.

The silver halide emulsions may further contain either or not in combination with one or more developing agents pH controlling ingredients, and other ingredients such as antifogging agents, development accelerators, wetting agents, and hardening agents for gelatin.

The silver halide emulsion layer may comprise light-screening dyes that absorb scattering light and thus promote the image sharpness and, as a consequence thereof, the sharpness of the final printed copy. Light-absorbing dyes that can be used as light-screening dyes have been described in i.a. U.S. Pat. No. 4,092,168, 4,311,787, DE-A 2,453,217 and GB-A 1,907,440. More details about the composition, preparation and coating of silver halide emulsions can be found in e.g. Product Licensing Index, Vol. 92, December 1971, publication 9232, p. 107–109.

As an interesting variant in the DTR-process the silver halide emulsion may consist of a first light-sensitive silver halide emulsion in which a normal latent image is formed upon image-wise exposure and a second silver halide emulsion whose speed is so low that no or almost no latent image is formed therein. When the low-speed silver halide emulsion and the light-sensitive silver halide emulsion are coated to form different layers, the resulting emulsion layers are arranged in DTR-processing in such a way that the low-speed emulsion is remotest from the image-receiving layer. It is also possible to coat one single layer comprising a mixture of both types of emulsion.

Thanks to the combination of light-sensitive and low-speed emulsions a silver image having an enhanced contrast can be obtained.

As the sensitivity of the low speed emulsion must be low enough to be inert in the photo-exposure, no second ripening or after-ripening thereof is applied.

The low-speed emulsion may be a pure silver chloride emulsion or an emulsion of mixed silver halides comprising silver chloride e.g. a silver chlorobromide or chlorobromoiodide emulsion. However, the low-speed emulsion is preferably a silver chloride emulsion for the greater part. Preferably a fine-grain silver chloride having a particle size in the range of 50 to 500 nm is used.

In case a mixture of low-speed emulsion and of imaging emulsion is coated to form one single layer, the amount of low-speed emulsion may vary within wide limits. Favourable results can be obtained when the ratio of low-speed silver chloride-containing emulsion to image-forming emulsion, expressed in parts by weight of silver nitrate, ranges from 10:1 to 1:1.

Apart from negative-working silver halide emulsions that are preferred for their high light-sensitivity, use can be made also of direct-positive silver halide emulsions that produce a positive silver image.

For instance, direct-positive silver halide emulsions that mainly forms an internal image as described in e.g. EP-A 365,926 and U.S. Pat. No. 3,062,651 may be employed. Alternatively, prefogged direct-positive silver halide emulsions with internal or, more preferably, with external electron traps as disclosed in EP-A 94201899 and EP-A 481,562 are also suitable for use in connection with the present invention.

The silver halide emulsion coated side of the photographic material can be provided with a top layer that contains hydrophilic colloids that form a water-permeable layer. Such top layer is usually free of gelatin. Its nature is such that it does not inhibit or restrain the diffusion transfer of the complexed silver but acts e.g. as an anti-stress layer. Appropriate hydrophilic binding agents for such top layer are e.g. methyl cellulose, the sodium salt of carboxymethyl cellulose, hydroxyethyl cellulose, hydroxyethyl starch, hydroxypropyl starch, sodium alginate, gum tragacanth, starch, polyvinyl alcohol, polyacrylic acid, polyacrylamide, poly-N-vinyl pyrrolidinone, polyoxyethylene, and copoly(methylvinylether/maleic acid). The thickness of this layer depends on the nature of the colloid used and the required mechanical strength. Such layer if present may be transferred at least partially to the image-receiving layer without deleterious action on the image formation.

It is preferred that the sum of the coverage of the hydrophilic colloids contained in said top layer and the emulsion layer is not more than 3.5 g/m², more preferred not more than 2.5 g/m².

The imaging element of the present embodiment may contain other additional layers comprising a hydrophilic colloid in water-permeable relationship with the silver halide emulsion layer. Preferably, the total sum of the coverage of the hydrophilic colloids comprised in the photosensitive layer and in all other layers of the imaging material comprising a hydrophilic colloid and being in water-permeable contact with the photosensitive layer is not more than 8.5 g/m², more preferably not more than 6.5 g/m².

It is especially advantageous to include a base-layer between the support and the photosensitive silver halide emulsion layer. Preferably, the sum of the coverage of the hydrophilic colloids contained in said base layer, the top layer, that is essentially free from silver halide emulsion and the emulsion layer is not more than 6 g/m², more preferably not more than 5.5 g/m². In a preferred embodiment of the present invention said base-layer serves as an antihalation layer so that the reflectance of the support containing said antihalation layer is not more than 25% and preferably not more than 15%. This layer can therefore contain the same light-absorbing dyes as described above for the emulsion layer: as alternative finely divided carbon black can be used for the same antihalation purposes as described in U.S. Pat. No. 2,327,828. Alternatively the support itself may be selected such that it can serve as antihalation means as described in e.g. U.S. Pat. No. 4,165,237. On the other hand, in order to gain sensitivity, light reflecting pigments, e.g. titaniumdioxide can be present. Further this layer can contain hardening agents, matting agents, e.g. silica particles, and wetting agents. At least part of these matting agents and/or light reflection pigments may also be present in the silver halide emulsion layer the most part however preferably being present in said base-layer. As a further alternative the light reflecting pigments may be present in a separate layer provided between the antihalation layer and the photosensitive silver halide emulsion layer.

The hydrophilic colloid binder, which is comprised in the various layers of the imaging material, is usually gelatin. But instead of or together with gelatin, use can be made of one or more other natural and/or synthetic hydrophilic colloids, e.g. albumin, casein, zein, polyvinyl alcohol, alginic acids or salts thereof, cellulose derivatives such as carboxymethyl cellulose, modified gelatin, e.g. phthaloyl gelatin etc.. The nature of the binder is such that the amount of liquid taken up by the imaging element when soaked for 1 min. in a 0.1N aqueous solution of NaOH is preferably between 3.5 ml and 7 ml for 1 g binder.

The support of the imaging material may be opaque or transparent, e.g. a paper support or resin support.

In a preferred embodiment in connection with the present invention a backing layer is provided at the non-light sensitive side of the support. This layer which can serve as anti-curl layer can contain i.a. matting agents e.g. silica particles, lubricants, antistatic agents, light absorbing dyes, opacifying agents, e.g. titanium oxide and the usual ingredients like hardeners and wetting agents. The backing layer can consist of one single layer or a double layer pack.

Processing of the information-wise exposed imaging element whilst in contact with the receiving material in accordance with the DTR process includes development of the exposed silver halide in the emulsion layer of the photosensitive element, the complexing of residual undeveloped silver halide and the diffusion transfer of the silver complexes into the image-receiving material wherein physical development takes place.

The developing agent or a mixture of developing agents can be incorporated into the alkaline processing solution and/or into the imaging material. When incorporated into the photosensitive element, the developing agent(s) can be present in the silver halide emulsion layer or is (are) preferably present in a hydrophilic colloid layer in water-permeable relationship therewith, e.g. in the anti-halation layer adjacent to the silver halide emulsion layer of the photosensitive element. In case the developing agent or a mixture of developing agents is in its total contained in the photosensitive element, the processing solution is merely an aqueous alkaline solution that initiates and activates the development.

Suitable developing agents for the exposed silver halide are e.g. hydroquinone-type and 1-phenyl-3-pyrazolidone-type developing agents as well as p-monomethylaminophenol. Preferably used is a combination of a hydroquinone-type and 1-phenyl-3-pyrazolidone-type developing agent whereby the latter is preferably incorporated in one of the layers comprised on the support of the imaging material. A preferred class of 1-phenyl-3-pyrazolidone-type developing agents is disclosed in EP-A 498968.

The silver halide solvent, preferably sodium or ammonium thiosulphate, may be supplied from the non-light-sensitive image-receiving element as mentioned above, but it is normally at least partly already present in the alkaline processing solution. When present in the alkaline processing solution, the amount of silver halide solvent is in the range of e.g. 10 g/l to 50 g/l.

Preferred alkaline substances are inorganic alkali e.g. sodium hydroxide, sodium or potassium carbonate, sodium phosphate, sodium borate or alkanolamines or mixtures thereof. Preferably used alkanolamines are tertiary alkanolamines e.g. those described in EP-A 397925, 397926, 397927, 398435 and U.S. Pat. No. 4,632,896. A combination of alkanolamines having both a $pK_a$ above or below 9 or a combination of alkanolamines whereof at least one has a $pK_a$ above 9 and another having a $pK_a$ of 9 or less may also be used as disclosed in the Japanese patent applications laid open to the public numbers 73949/61, 73953/61, 169841/61, 212670/60, 73950/61, 73952/61, 102644/61, 226647/63, 229453/63, U.S. Pat. No. 4,362,811, 4,568,634 etc.. The concentration of these alkanolamines is preferably from 0.1 mol/l to 0.9 mol/l.

The alkaline processing solution usually contains preserving agents e.g. sodium sulphite, thickening agents e.g. hydroxyethylcellulose and carboxymethylcellulose, fog-inhibiting agents such as potassium bromide, black-toning agents especially heterocyclic mercapto compounds, detergents etc..

The DTR-process is normally carried out at a temperature in the range of 10° C. to 35° C.

The pH of the processing solution is preferably in the range of 9 to 14, more preferably in the range of 10 to 13.

The present invention also provides an imaging element for obtaining a lithographic printing plate according to the DTR-process. Thus an imaging element is provided comprising on a support a silver halide emulsion layer and an image receiving layer containing physical development nuclei according to the invention. Suitable silver halide emulsions for use in accordance with this embodiment are those described above. To obtain good printing properties it is preferred that the image receiving layer is free of binder with the exception of the colloidal smectic clay whereon the physical development nuclei are precipitated or contains hydrophilic binder in an amount not more than 80% by weight of the image receiving layer. When the amount of binder is larger than 80% the physical development nuclei will be imbedded in the binder matrix so that no or little silver is formed on the surface of the image receiving layer. As a consequence the silver image areas will not accept ink.

Suitable silver complexing agents also called silver halide solvents for use in connection with this embodiment are e.g. thiosulphate or thiocyanate in an amount ranging from 5 g to 20 g per liter. Other interesting silver halide complexing agents are e.g. sulphite, amines, 2-mercaptobenzoic acid, cyclic imide compounds such as e.g. uracil, 5,5-dialkylhydantoins, alkyl sulfones and oxazolidones.

Further silver halide solvents for use in connection with the present embodiment are alkanolamines. Said alkanolamines may be present in the alkaline processing liquid in a concentration preferably between 0.1% and 5% by weight. However part or all of the alkanolamine can be present in one or more layers of the imaging element.

Still other preferred further silver halide solvents for use in connection with the present embodiment are thioethers, preferably di- or poly-thioethers as disclosed in e.g. U.S. Pat. No. 4,960,683 and EP-A 554,585.

Still further suitable silver halide solvents are meso-ionic compounds, preferably 1,2,4-triazolium-3-thiolates.

Combinations of different silver halide solvents can be used and it is also possible to incorporate at least one silver halide solvent into a suitable layer of the imaging element and to add at least one other silver halide solvent to the developing or activating solution. Preferably they are comprised in the alkaline processing liquid.

In connection with this embodiment two layer arrangements can be used for obtaining an imaging element suitable for making a lithographic printing plate according to the DTR-process. According to a first arrangement a support e.g. paper or an organic resin support is provided in the order given with a photosensitive silver halide emulsion layer and the image receiving layer of the present invention, said photosensitive layer being in water permeable relationship with said image receiving layer. The imaging element preferably also contains a base layer between the support and the silver halide emulsion layer serving as an anti-halation layer such as the anti-halation layer described above. After information-wise exposure and development according to the DTR-process using a processing liquid as described above but with the appropiate silver halide solvents a silver image is obtained in the image receiving layer. After this development step the imaging element is preferably guided through a neutralization liquid to reduce the alkaline pH of the surface of the developed imaging element. The neutralization liquid contains buffer ions, e.g. phosphate buffer or citrate buffer to establish in said liquid a pH value ranging from 5.0 to 7.0. The neutralization solution can further contain bactericides, e.g. phenol, thymol or 5-bromo-5-nitro-1,3-dioxan as described in EP 0,150,517. Finally the neutralization solution can contain wetting agents, preferably compouds containing perfluorinated alkyl groups.

To improve the differentiation between the hydrophobic silver image and the hydrophilic background the alkaline processing liquid and/or neutralization liquid preferably contain one or more hydrophobizing agents. Generally these compounds contain a mercapto group or thiolate group and one or more hydrophobic substituents, e.g. those described in U.S. Pat. No. 3,776,728 and U.S. Pat. No. 4,563,410. Preferred hydrophobizing agents are 2-mercapto-1,3,4-thiadiazoles as described in DE-A 1,228,927 and in U.S. Pat. No. 4,563,410, 2-mercapto-5-alkyl-1,3,4-oxadiazoles, 3-mercapto-5-alkyl-1,2,4-triazoles and long chain (at least 5 carbon atoms) alkyl substituted mercaptotetrazoles. Particularly preferred compounds are 2-mercapto-5-n-heptyl-1,3,4-oxadiazole and 3-mercapto-4-acetamido-5-n-heptylalkyl-1,2,4-diazoles According to the second arrangement an imaging element comprises in the order given on a hydrophilic surface of a support (i) an image receiving layer containing physical development nuclei in accordance with the present invention and (ii) a photosensitive silver halide emulsion layer, said photosensitive layer being in water permeable relationship with said image receiving layer. To obtain a lithographic plate by means of the DTR-process said imaging element may be imaged using an information-wise exposure followed by a development step in the presence of development agent(s) and silver halide solvent(s) as described above so that a silver image is formed in the physical development nuclei layer. Subsequently the imaging element is treated to remove the layer(s) on top of the image receiving layer, preferably by rinsing the imaging element with water, thereby exposing the imaged surface of the support by uncovering said silver image formed in said image receiving layer. Finally the hydrophobic character of the silver image is preferably improved using a finishing liquid comprising hydrophobizing agents as described above.

The hydrophilic surface of a support can be a hardened hydrophilic layer, containing a hydrophilic synthetic homopolymer or copolymer and being hardened with a hydrolyzed tetraalkyl orthosilicate crosslinking agent coated on a flexible hydrophobic base.

More preferably an aluminum support is used as a hydrophilic base.

The aluminum support of the imaging element for use in accordance with the present invention can be made of pure aluminum or of an aluminum alloy, the aluminum content of which is at least 95%. The thickness of the support usually ranges from about 0.13 to about 0.50 mm.

The preparation of aluminum or aluminum alloy foils for lithographic offset printing comprises the following steps: graining, anodizing, and optionally post-treating of the foil. Preferably the aluminum foil has a roughness with a CLA value between 0.2 and 1.5 µm, an anodization layer with a thickness between 0.4 and 2.0 µm and is post-treated with an aqueous bicarbonate solution.

According to the present invention the roughening of the aluminum foil can be performed according to the methods well known in the prior art. The surface of the aluminum substrate can be roughened either by mechanical, chemical or electrochemical graining or by a combination of these to obtain a satisfactory adhesiveness of a silver halide emulsion layer to the aluminum support and to provide a good water retention property to the areas that will form the non-printing areas on the plate surface.

The electrochemical graining process is preferred because it can form a uniform surface roughness having a large average surface area with a very fine and even grain which is commonly desired when used for lithographic printing plates.

Electrochemical graining can be conducted in a hydrochloric and/or nitric acid containing electrolyte solution using an alternating or direct current. Other aqueous solutions that can be used in the electrochemical graining are e.g. acids like HCl, $HNO_3$, $H_2SO_2$, $H_3PO_4$, that if desired, contain additionally one or more corrosion inhibitors such as $Al(NO_3)_3$, $AlCl_3$, boric acid, chromic acid, sulfates, chlorides, nitrates. monoamines, diamines, aldehydes, phosphates, $H_2O_2$, etc. . . .

Electrochemical graining in connection with the present invention can be performed using single-phase and three-phase alternating current. The voltage applied to the aluminum plate is preferably 10–35 V. A current density of 3–150 Amp/$dm^2$ is employed for 5–240 seconds. The temperature of the electrolytic graining solution may vary from 5°–50° C. Electrochemical graining is carried out preferably with an alternating current from 10 Hz to 300 Hz.

The roughening is preferably preceded by a degreasing treatment mainly for removing fatty substances from the surface of the aluminum foil.

Therefore the aluminum foil may be subjected to a degreasing treatment with a surfactant and/or an aqueous alkaline solution.

Preferably roughening is followed by a chemical etching step using an aqueous solution containing an acid. The chemical etching is preferably carried out at a temperature of at least 30° C. more preferably at least 40° C. and most preferably at least 50° C.

Suitable acids for use in the aqueous etch solution are preferably inorganic acids and most preferably strong acids. The total amount of acid in the aqueous etch solution is preferably at least 150 g/l. The duration of chemical etching is preferably between 3 s and 5 min.

After roughening and optional chemical etching the aluminum foil is anodized which may be carried out as follows.

An electric current is passed through the grained aluminum foil immersed as an anode in a solution containing sulfuric acid, phosphoric acid, oxalic acid, chromic acid or organic acids such as sulfamic, benzosulfonic acid, etc. or mixtures thereof. An electrolyte concentration from 1% to 70% by weight can be used within a temperature range from 0°–70° C. The anodic current density may vary from 1–50 A/dm$^2$ and a voltage within the range 1–100 V to obtain an anodized film weight of 1–8 g/m$^2$ Al$_2$O$_3$.H$_2$O. The anodized aluminum foil may subsequently be rinsed with demineralized water within a temperature range of 10°–80° C.

After the anodizing step a posttreatment such as sealing may be applied to the anodic surface. Sealing of the pores of the aluminum oxide layer formed by anodization is a technique known to those skilled in the art of aluminum anodization. This technique has been described in e.g. the "Belgisch-Nederlands tijdschrift voor Oppervlaktetechnieken van materialen", 24ste jaargang/januari 1980, under the title "Sealing-kwaliteit en sealing-controle van geanodiseerd Aluminum". Different types of sealing of the porous anodized aluminum surface exist.

A preferred posttreatment is performed by treating a grained and anodized aluminum support with an aqueous solution containing a bicarbonate as disclosed in EP-A 567178, which therefor is incorporated herein by reference.

Preferably each of the above described steps is separated by a rinsing step to avoid contamination of the liquid used in a particular step with that of the preceding step.

To facilate the removal of the silver halide emulsion layer(s) an intermediate layer comprising a hydrophilic non-proteinic film forming polymer e.g. polyvinyl alcohol as disclosed in EP-A 410,500 or water swellable polymer beads e.g. polymethyl methacrylate beads as disclosed in U.S. Pat. No. 5,273,858 or mixtures thereof may be included between the nuclei containing layer and silver halide emulsion layer. This intermediate layer may also include anti-halation substances so that said layer may also serve as an anti-halation layer during exposure of the imaging element.

According to the present embodiment for obtaining a lithographic printing plate the silver halide emulsion contained in the DTR element may be orthochromatically sensitized with a conventional cyanine or merocyanine dye so that said DTR element can be exposed on a process camera using an ordinary light source, e.g. tungsten light.

According to the present embodiment the imaging element can also be used as recording materials for phototypesetting and image-setting devices which employ laser beams as their output energy source.

DTR imaging elements suited for exposure by helium-neon laser (HeNe) or light emitting diode (LED), both devices emitting in the red region of the visual spectrum, according to the present invention may be prepared using an appropriate sensitized silver halide emulsion as disclosed in e.g. U.S. Pat. No. 4,501,811 and Japanese Unexamined Patent Publication (Kokai) Nos. 71055/84 and 75838/85.

On the other hand semiconductor lasers, also called laserdiodes, can be used in connection with the present invention by sensitizing the silver halide emulsion to wavelengths above 700 nm using spectral sensitizers as disclosed in e.g. EP 423 399 and U.S. Pat. No. 4,784,933.

The present invention will now be illustrated by the following examples without however limiting it thereto. All parts are by weight unless otherwise specified.

EXAMPLE 1

Comparative Example

Preparation of the coating solutions 1 to 6.

A comparitive coating solution containing PdS physical development nuclei 1 was prepared as follows.

| | | |
|---|---|---|
| Solution A (20° C.): | (NH$_4$)$_2$ PdCl$_4$ | 1.74 g |
| | water | 400 ml |
| Solution B (20° C.): | Na$_2$S.9H$_2$O | 1.61 g |
| | water | 400 ml |
| Solution C (20° C.): | Na$_2$S.9H$_2$O | 3.23 g |
| | water | 800 ml |

Solution A and B were simultaneously added to solution C at a rate of 100 ml/min. whilst stirring solution C at 400 rpm. To remove the excess sulphide the obtained mixture was dialysed using a hollow fiber dialyser having a surface of 1.5 m$^2$ and a molecular cut-off of 8000. The solution containing the PdS-nuclei was pumped through the dialyser with a delivery of 400 ml/min. and water flows around the fibers with a delivery of 400 ml/min. The solution was brought to a conductivity of 0.5 mS and the pH was kept between 7.2 and 7.8.

A coating solution containing PdS physical development nuclei according to the invention 2 was prepared similar to the above procedure with the exception that to each of the solutions A, B and C 0.5 g LAPONITE RDS/l water was added. It was proven by HREM-EDX examination with a PHILIPS CM 20-EDAX that the PdS nuclei are grown on the LAPONITE RDS.

A comparitive coating solution containing Ag° physical development nuclei 3 was prepared as follows.

| | | |
|---|---|---|
| Solution A (40° C.): | AgNO$_3$ (3 molar in water) | 2.60 ml |
| | water | 500 ml |
| Solution B (40° C.): | KBH$_4$ | 0.40 g |
| | water | 500 ml |
| Solution C (40° C.): | KBH$_4$ | 0.80 g |
| | water | 800 ml |

Solution A and B were simultaneously added to solution C at a rate of 100 ml/min. whilst stirring solution C at 400 rpm and keeping the temperature at 40° C. The resulting dispersion has a concentration of 0.0038 mole Ag°/l.

A coating solution containing Ag° physical development nuclei according to the invention 4 was prepared as follows.

| | | |
|---|---|---|
| Solution A (40° C.): | AgNO$_3$ (3 molar in water) | 2.60 ml |
| | LAPONITE RDS (1% solution in water) | 50 ml |
| | water | 450 ml |

-continued

| Solution B (40° C.): | KBH$_4$ | 0.40 g |
| | LAPONITE RDS (1% solution in water) | 50 ml |
| | water | 450 ml |
| Solution C (40° C.): | KBH$_4$ | 0.80 g |
| | LAPONITE RDS (1% solution in water) | 80 ml |
| | water | 720 ml |

Solution A and B were simultaneously added to solution C at a rate of 100 ml/min. whilst stirring solution C at 400 rpm and keeping the temperature at 40° C. The resulting dispersion has a concentration of 0.0038 mole Ag°/l and 1 g LAPONITE RDS/l. It was proven by HREM-EDX examination with a PHILIPS CM 20-EDAX that the Ag° nuclei are grown on the LAPONITE RDS.

A comparitive coating solution containing Au° physical development nuclei 5 was prepared similar to the above described solution 3 with the exception that the 2.60 ml AgNO$_3$ was replaced by 2.89 g KAuCl$_4$. The resulting dispersion has a concentration of 0.0038 mole Au°/l.

A coating solution containing Au° physical development nuclei according to the invention 6 was prepared similar to the above described solution 4 with the exception that the 2.60 ml AgNO$_3$ was replaced by 2.89 g KAuCl$_4$ and the LAPONITE RDS by LAPONITE JS in the same amount. The resulting dispersion has a concentration of 0.0038 mole Au°/l and 1 g LAPONITE JS/l. It was proven by HREM-EDX examination with a PHILIPS CM 20-EDAX that the Au° nuclei are grown on the LAPONITE JS.

The colloidal stability of these dispersions was visually evaluated on a scale from 1 to 5, wherein 1 stands for a stable dispersion (no flocculation of the physical development nuclei after standing for 24 h at 20° C.) and 5 stands for a very unstable dispersion (pratically complete flocculation of the physical development nuclei after standing for 0.5 h at 20° C.). The results are given in table 1.

TABLE 1

| Dispersion | Colloidal stability |
|---|---|
| 1 | 4 |
| 2 | 1 |
| 3 | 5 |
| 4 | 1 |
| 5 | 5 |
| 6 | 1 |

It is clear from the results in table 1 that the comparative dispersions 1, 3 and 5, comprising physical development nuclei which are not grown on a colloidal smectic clay (LAPONITE RDS or LAPONITE JS) have a very low stability while the dispersions according to the invention 2, 4 and 6, comprising physical development nuclei which are grown on a colloidal smectic clay (LAPONITE RDS or LAPONITE JS) have a very high stability so that during the coating of an image receiving layer with said dispersions containing said physical development nuclei a constant amount of said physical development nuclei with stable dimensions is applied during the whole duration of the coating of said layer, even when the coating takes several hours.

EXAMPLE II

Preparation of the silver halide emulsion coating solution.

A silver chlorobromide emulsion composed of 98.2% of chloride and 1.8% of bromide was prepared by the double jet precipitation method. The average silver halide grain size was 0.4 µm (diameter of a sphere with equivalent volume) and contained Rhodium ions as internal dopant. The emulsion was orthochromatically sensitized and stabilized by 1-phenyl-5-mercapto-tetrazole.

A base layer coating solution was prepared having the following composition:

| gelatin | 5.5% |
|---|---|
| carbon black | 0.76% |
| silica particles (5 µm) | 1.6% |

Preparation of the imaging element:

The silver halide emulsion coating solution was coated simultaneously with the base layer coating solution by means of the slide hopper coating technique to a polyethylene terephthalate support provided with a pack of two backing layers such that the base layer coating was coated directly to the side of the support opposite to the side containing said backing layers. The silver halide emulsion layer was coated such that the silver halide coverage expressed as AgNO$_3$ was 1.5 g/m$^2$ and the gelatin content was 1.5 g/m$^2$. The silver halide emulsion layer further contained 0.15 g/m$^2$ of 1-phenyl-4,4'-dimethyl-3-pyrazolidone and 0.25 g/m$^2$ of hydroquinone. The base layer was coated such that the amount of gelatin in the coated layer was 3 g/m$^2$.

The layer nearest to the support of the backing layer pack contained 0.3 g/m$^2$ of gelatin and 0.5 g/m$^2$ of the antistatic agent co(tetraallyloxyethane/methacrylate/acrylic acid-K-salt) polymer. The second backing layer contained 4 g/m$^2$ of gelatin, 0.15 g/m$^2$ of a matting agent consisting of transparent spherical polymeric beads of 3 micron average diameter according to EP-A-080,225, 0.05 g/m$^2$ of hardening agent triacrylformal and 0.021 g/m$^2$ of wetting agent F$_{15}$C$_7$-COONH$_4$. The thus obtained element was dried and subjected to a temperature of 40° C. for 5 days and then the silver halide emulsion layer was overcoated with a layer containing the physical development nuclei of dispersion 2 of example I at 0.7 mg PdS/m$^2$, LAPONITE RDS at 0.67 mg/m$^2$, hydroquinone at 0.4 g/m$^2$ and formaldehyde at 100 mg/m$^2$.

The following processing solutions were prepared:

Activator solution

| sodium hydroxide (g) | 30 |
|---|---|
| sodium sulphite anh. (g) | 35 |
| potassium thiocyanate (g) | 20 |
| 2-mercapto-5-n.heptyl-oxa-3,4-diazole (mg) | 150 |
| water to make | 1 l |

Neutralization solution

| citric acid | 10 g |
|---|---|
| sodium citrate | 35 g |
| cysteine | 1 g |
| sodium sulphite anh. | 5 g |
| phenol | 50 mg |
| water to make | 1 l |

Dampening solution

| water | 880 ml |
|---|---|
| citric acid | 6 g |

-continued

| | |
|---|---|
| boric acid | 8.4 g |
| sodium sulphate anh. | 25 g |
| ethyleneglycol | 100 g |
| colloidal silica | 28 g |

The above described imaging element was image-wise exposed and processed with the above described activator for 10 seconds at 30° C., subsequently neutralized at 25° C. with the neutralization solution described above and dried.

The printing plate thus prepared was mounted on an offset printing machine HEIDELBERG GTO-52, marketed by Heidelberg, A. G., Germany, equipped with a DAHLGREN "3-roll" dampening system, and was used for printing. The above mentioned dampening solution was used at a 3% concentration in an aqueous solution containing 10% isopropanol as fountain solution. The ink used was VAN SON RUBBERBASE RB 2329, marketed by Van Son, Royal Dutch Ink Factories, Hilversum, The Netherlands. A compressible rubber blanket was used.

Evaluation:

Table 2 lists the minimum and maximum reflection density, gradient, ink acceptance and printing endurance obtained with a printing plate obtained from a printing plate precursor comprising in the image receiving layer physical development nuclei precipitated on LAPONITE RDS in accordance with the invention. The obtained results for these characteristics are very good.

TABLE 2

| $D_{min}^a$ | $D_{max}^b$ | G 60/85$^c$ | I. A.$^d$ | Pr. End.$^e$ |
|---|---|---|---|---|
| 0.57 | 1.34 | −3.06 | 20 | >10.000 |

Remarks:
$^a D_{min}$: minimum density of the plate measured in reflection.
$^b D_{max}$: maximum density of the plate measured in reflection.
$^c$G 60/85: the gradient of the sensitometric curve of the printing plate between the points 60% and 85% above the minimum density.
$^d$I. A.: Ink Acceptance; the number of copies that had to be disposed off at the start of the printing process because of poor ink acceptance in the printing areas.
$^e$Pr. End.: printing endurance; the maximum number of copies that can be printed from one printing plate still having a good quality.

We claim:

1. An image receiving material comprising a receiving layer containing physical development nuclei characterized in that said physical development nuclei are grown on a colloidal smectic clay.

2. An image receiving material according to claim 1 wherein said colloidal smectic clay is a synthetic smectite clay.

3. An image receiving material according to claim 1 wherein said colloidal smectic clay is a synthetic laponite clay.

4. An image receiving material according to claim 1 wherein the weight ratio between the physical development nuclei and the colloidal smectic clay ranges from 10:1 to 1:10.

5. An image receiving material according to claim 1 wherein said physical development nuclei have a number average diameter in the range from 0.5 nm to 30 nm.

6. An image receiving material according to claim 1 further comprising on said support a silver halide emulsion layer.

7. An image receiving material according to claim 6 wherein the image receiving layer is the outermost layer.

8. An image receiving material according to claim 6 wherein the surface of said support is hydrophilic and said image receiving layer is provided directly on said support.

9. A method for obtaining an image comprising the steps of information-wise exposing an imaging element comprising on a support a silver halide emulsion and developing said information-wise exposed imaging element in the presence of developing agent(s) and silver halide solvent(s) whilst in contact with a non-light sensitive image receiving material according to claim 1.

10. A method for obtaining a lithographic printing plate comprising the steps of information-wise exposing an imaging element according to claim 7 and subsequently developing said information-wise exposed imaging element in the presence of developing agent(s) and silver halide solvent (s).

11. A method for obtaining a lithographic printing plate comprising the steps of information-wise exposing an imaging element according to claim 8, subsequently developing said information-wise exposed imaging element in the presence of developing agent(s) and silver halide solvent(s) thereby forming a silver image in said image receiving layer and rinsing said developed imaging element with water to expose said silver image formed in said image receiving layer.

* * * * *